US007993807B2

(12) United States Patent
Kasperchik et al.

(10) Patent No.: US 7,993,807 B2
(45) Date of Patent: Aug. 9, 2011

(54) COMPOSITIONS, SYSTEMS, AND METHODS FOR IMAGING

(75) Inventors: Vladek Kasperchik, Corvallis, OR (US); William Dorogy, Corvallis, OR (US); Makarand Gore, Corvallis, OR (US); Marshall Field, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 984 days.

(21) Appl. No.: 10/833,728

(22) Filed: Apr. 28, 2004

(65) Prior Publication Data

US 2005/0244741 A1 Nov. 3, 2005

(51) Int. Cl.
*G03F 7/00* (2006.01)
*G03F 7/004* (2006.01)

(52) U.S. Cl. ................ 430/270.1; 430/138; 430/270.15; 430/332; 430/374; 430/964; 430/962

(58) Field of Classification Search .................. 430/138, 430/270.1, 270.15, 270.2, 332, 374, 964, 430/962
See application file for complete search history.

(56) References Cited

U.S. PATENT DOCUMENTS 4,598,035 A * 7/1986 Usami et al. .................. 503/213
4,853,362 A 8/1989 Satake et al.
5,443,908 A * 8/1995 Matsushita et al. ...... 428/402.24
5,494,772 A 2/1996 Hosoi et al.
5,543,382 A 8/1996 Watanabe et al.
5,945,247 A * 8/1999 Shimada ........................ 430/138
6,015,896 A 1/2000 Mistry et al.
6,022,648 A 2/2000 Jacobson et al.
6,025,486 A 2/2000 Mistry et al.
6,251,571 B1 6/2001 Dessauer et al.
6,500,536 B1 * 12/2002 Yamada et al. ............... 428/346
6,740,465 B2 * 5/2004 Liang et al. ................... 430/138
7,064,152 B2 * 6/2006 Kalgutkar et al. .............. 522/15
7,270,865 B2 9/2007 Gore
2002/0045548 A1 4/2002 Saito
2002/0089580 A1 7/2002 Suzuki et al.
2002/0183203 A1 12/2002 Hoefs et al.
2003/0003399 A1 1/2003 Muller et al.
2004/0023136 A1 * 2/2004 Munnelly et al. ............... 430/18

FOREIGN PATENT DOCUMENTS

EP 0 716 135 9/1999
GB 2 216 676 A 10/1989
JP 1291979 A 11/1980
JP 7228051 A 8/1995
JP 2005199440 A 7/2005

OTHER PUBLICATIONS

H. Bouas-Laurent et al., "Organic Photochromism" (IUPAC Technical Report), Pure Appl. Chem., vol. 73, No. 4, pp. 639-665, 2001.

* cited by examiner

*Primary Examiner* — Amanda C. Walke

(57) ABSTRACT

A composition, method, and system for recording an image. The system includes a multiphase imaging material in which energy is absorbed by an antenna material. The absorbed energy causes the reaction of an activator and a color-forming material to form a mark. A fixer is employed to retard the fading of the mark.

16 Claims, 1 Drawing Sheet

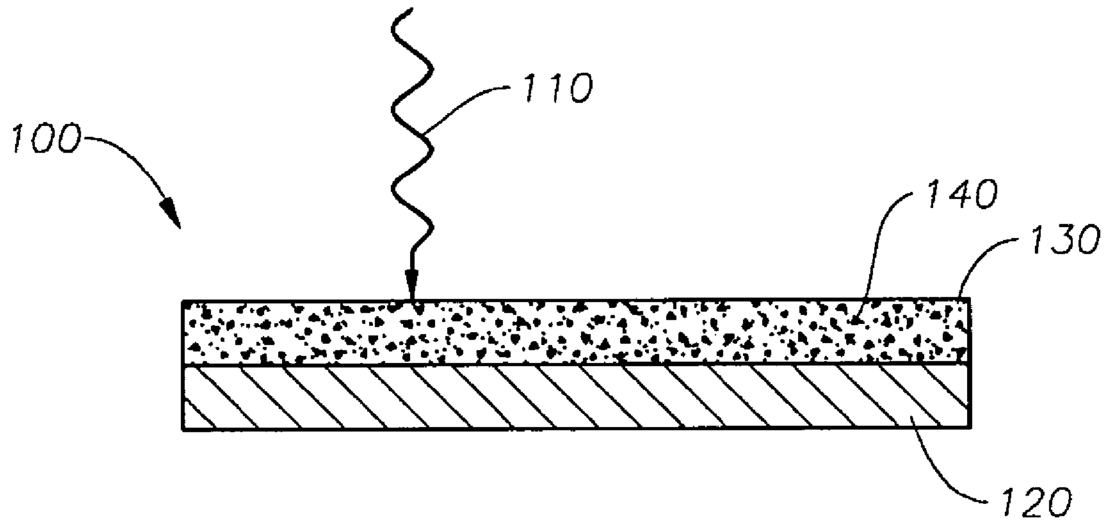
110
100
140
130
120

COMPOSITIONS, SYSTEMS, AND METHODS FOR IMAGING

BACKGROUND

Materials that produce color change upon stimulation with energy (e.g., light or heat) may have possible applications in imaging. For example, such materials may be found in thermal printing papers and instant imaging films. Generally, the materials and compositions known so far may require a multifilm structure and further processing to produce an image (e.g., instant imaging camera films). And in the case of facsimile and thermal head media, high energy input of greater than 1 $J/cm^2$ is needed to achieve good images. The compositions in multifilm media may require control of diffusion of color-forming chemistry and further processing, and are in separate phases and layers. Most thermal and facsimile paper coatings consist of coatings prepared by preparing fine dispersions of more than two components. The components mix and react upon application of energy, resulting in a colored material. To the necessary mixing, the particles need to contact across three or more phases or layers and merge into a new phase. Because of these multiple phases and layers, high energy is required to perform this process. For example, a relatively powerful carbon dioxide laser with an energy density of 3 $J/cm^2$ at times of much greater than 100 μs may be needed to produce a mark. In some instances, this high energy application may cause damage to the imaging substrate. In many situations, it may be desirable to produce a visible mark more efficiently using either a less intense, less powerful, and/or shorter energy application. Therefore, there is a need for fast marking coatings, possibly composed of fewer than three phases and in single layer. Such coatings may fade over time. It may be desirable to produce such fast marking coatings which resist fading.

BRIEF SUMMARY

Disclosed herein are imaging materials and methods of making imaging materials. The materials disclosed herein may include an antenna, a color former, an activator, and a fixer, all dispersed in a matrix. The color former and the activator are present in the imaging material in two separate phases. The color former and the activator mix, causing the color former to change color. The fixer comprises a compound which retards the fading of the mark.

BRIEF DESCRIPTION OF THE DRAWINGS

For a detailed description of embodiments of the invention, reference will now be made to the accompanying drawing showing an imaging medium according to an embodiment of the present invention.

Notation and Nomenclature

Certain terms are used throughout the following description and claims to refer to particular system components. As one skilled in the art will appreciate, companies may refer to components by different names. This document does not intend to distinguish between components that differ in name but not function. In the following discussion and in the claims, the terms "including" and "comprising" are used in an open-ended fashion, and thus should be interpreted to mean "including, but not limited to . . . ." The term "leuco dye" is a color forming substance which is colorless or one color in a non-activated state and produces or changes color in an activated state. As used herein, the term "activator" includes a substance which reacts with a leuco dye and causing the leuco dye to alter its chemical structure and change or acquire color. By way of example only, activators may be phenolic or other proton donating species which can effect this change. The term "antenna" means any radiation absorbing compound which readily absorbs a desired specific wavelength of the marking radiation.

DETAILED DESCRIPTION

The following discussion is directed to various embodiments of the invention. The embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Embodiments of the invention include coatings that result in clear marks and excellent image quality when marked with a laser. The materials used to produce color change upon stimulation by energy may include a color-former such as a fluoran leuco dye and an activator such as sulphonylphenol dispersed in a matrix such as radiation-cured acrylate oligomers and monomers and applied to a substrate. In particular embodiments, either the leuco dye or the activator may be substantially insoluble in the matrix at ambient conditions. An efficient radiation energy absorber that functions to absorb energy and deliver it to the reactants is also present in this coating. Energy may then be applied by way of, for example, a laser or infrared light. Upon application of the energy, either the activator, the color-former, or both may become heated and mix which causes the color-former to form an open lactone ring and a mark to be produced. A fixer comprising a Lewis acid such as a transition metal salt may accept electrons from the open ring and prevent it from closing, thus, preventing or retarding fading of the image.

Referring now to the embodiments illustrated in the drawing, there is shown imaging medium 100, energy 110, substrate 120, imaging composition 130, and suspended particles 140. Imaging medium 100 may comprise a substrate 120. Substrate 120 may be any substrate upon which it is desirable to make a mark, such as, by way of example only, paper (e.g., labels, tickets, receipts, or stationary), overhead transparencies, or the labeling surface of a medium such as a CD-R/RW/ROM or DVD±R/RW/ROM.

Imaging composition 130 may comprise a matrix, an activator, a radiation absorbing compound such as a dye, a color forming dye, and a fixing agent. The activator and the color forming dye, when mixed, may change color. Either of the activator and the color forming dye may be soluble in the matrix. The other component (activator or color forming dye) may be substantially insoluble in the matrix and may be suspended in the matrix as uniformly distributed particles 140. The fixing agent may be present in imaging composition 130 as finely ground powder or dispersed as a hot melt added before the addition of the insoluble component. The imaging composition 130 may be applied to the substrate via any acceptable method, such as, by way of example only, rolling, spraying, or screen printing.

Energy 110 may be directed imagewise to imaging medium 100. The form of energy may vary depending upon the equipment available, ambient conditions, and desired result. Examples of energy which may be used include IR radiation, UV radiation, x-rays, or visible light. The antenna may absorb the energy and heat the imaging composition 130. The heat may cause suspended particles 140 to reach a temperature sufficient to cause the interdiffusion of the color forming species initially present in the particles (e.g., glass transition temperatures ($T_g$) or melting temperatures ($T_m$) of particles 140 and matrix). The activator and dye may then react to form a color. One method of color formation may include a reaction in which a fluoran leuco dye reacts with an acidic activator. The lactone ring of the leuco dye opens upon the transfer of a proton from the activator resulting in color formation. This reaction may be easily reversible causing the loss of color. As an example of a reversal, a carboxyl in the open lactone ring may easily lose a proton, causing closure of the ring. The fixer (e.g., transition metal cation) may form a chelate complex with the carboxyl of the open lactone ring and prevent it from closing (i.e., preventing or retarding the loss of color).

Example 1 illustrates exemplary embodiments of the present invention. Several modifications may be made that are within the scope of the present invention. For example, antenna 60 may be any material which effectively absorbs the type of energy to be applied to the imaging medium to effect a mark. By way of example only, the following compounds IR780 (Aldrich 42,531-1) (1), IR783 (Aldrich 54,329-2) (2), Syntec 9/1 (3), Syntec 9/3 (4) metal complexes (such as dithiolane metal complexes (5) and indoaniline metal complexes (6)), Dye 724(7), Dye 683(8), or Oxazine 1(9) (7, 8, and 9 available from Organica Feinchemie GmbH Wollen) may be suitable antennae:

(1)

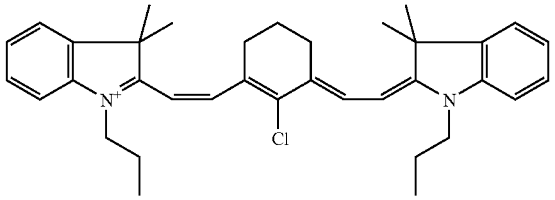

(2)

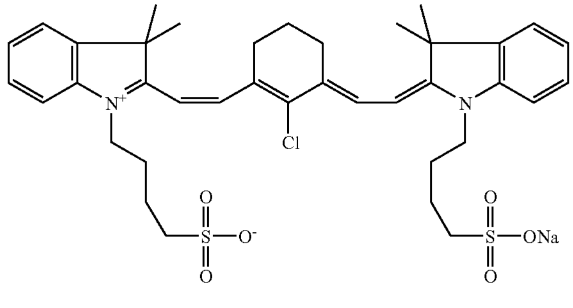

(3)

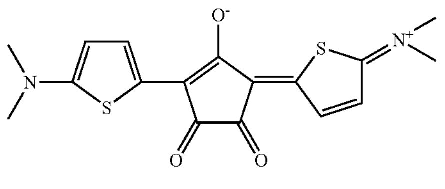

-continued (4)

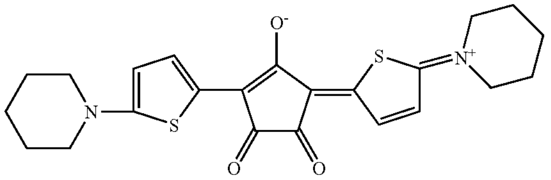

(5)

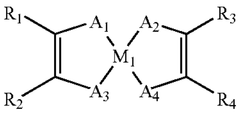

where $M_1$ is a transition metal, $R_1$, $R_2$, $R_3$, and $R_4$ are alkyl or aryl groups with or without halo substituents, and $A_1$, $A_2$, $A_3$, and $A_4$ can be S, NH, or Se;

(6)

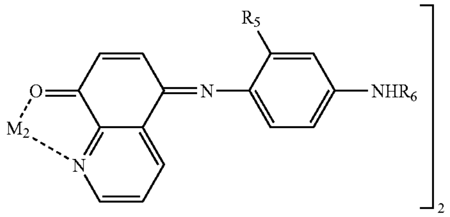

where $M_2$ is Ni or Cu and $R_5$ and $R_6$ are aryl or alkyl groups with or without halo substituents;

(7)

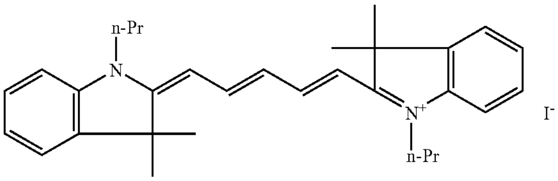

(8)

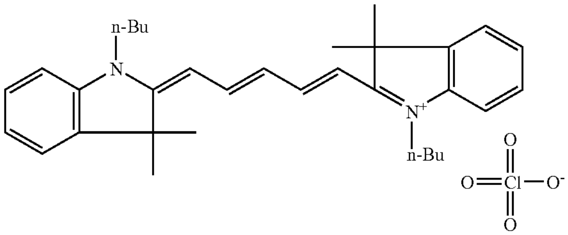

(9)

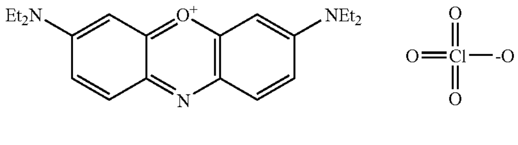

Additional examples of antennae can be found in "Infrared Absorbing Dyes," Matsuoka, Masaru, ed., Plenum Press (1990) (ISBN 0-306-43478-4) and "Near-Infrared Dyes for High Technology Applications," Daehne, S.; Resch-Genger, U.; Wolfbeis, O., Ed., Kluwer Academic Publishers (ISBN 0-7923-5101-0).

The activator (e.g., bisphenol-A) and color-forming dye 90 (e.g., 2-anilino-3-methyl-6-dibutylaminofluoran) may act in tandem to produce a mark. The activator and dye may be any two substances which when reacted together produce a color change. When reacted, the activator may initiate a color change in the dye or develop the dye. One of the activator and the dye may be soluble in the matrix at ambient conditions. The other may be substantially insoluble in the lacquer at ambient conditions. By "substantially insoluble," it is meant that the solubility of the other in the lacquer at ambient conditions is so low, that no or very little color change may occur due to reaction of the dye and the activator at ambient conditions. Although, in the embodiments described above, the activator may be dissolved in the lacquer and the dye remains suspended as a solid in the matrix at ambient conditions, it is also acceptable that the color former may be dissolved in the matrix and the activator may remain as a suspended solid at ambient conditions. Activators may include, without limitation, proton donors and phenolic compounds such as bisphenol-A and bisphenol-S. Color formers may include, without limitation, leuco dyes such as fluoran leuco dyes and phthalide color formers as described in "The Chemistry and Applications of Leuco Dyes," Muthyala, Ramiah, ed., Plenum Press (1997) (ISBN 0-306-45459-9). Non exclusive examples of acceptable fluoran leuco dyes comprise the structure shown in Formula (10)

(10)

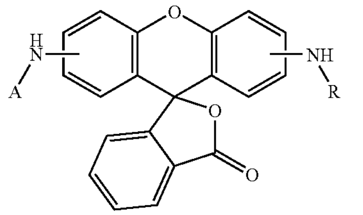

where A and R are aryl or alkyl groups.

Lacquer 30 may be any suitable matrix for dissolving and/or dispersing the activator, antenna, and color former. Acceptable lacquers may include, by way of example only, UV curable matrices such as acrylate derivatives, oligomers and monomers, with a photo package. A photo package may include a light absorbing species which initiates reactions for curing of a lacquer, such as, by way of example, benzophenone derivatives. Other examples of photoinitiators for free radical polymerization monomers and pre-polymers include but are not limited to: thioxanethone derivatives, anthraquinone derivatives, acetophenones and benzoine ether types. It may be desirable to choose a matrix which is cured by a form of radiation other than the type of radiation which causes a color change. Matrices based on cationic polymerization resins may require photo-initiators based on aromatic diazonium salts, aromatic halonium salts, aromatic sulfonium salts and metallocene compounds. An example of an acceptable lacquer or matrix may include Nor-Cote CDG000 (a mixture of UV curable acrylate monomers and oligomers) (available from Nor-Cote Int'l, Crawfordsville, Ind.) which contains a photoinitiator (hydroxy ketone) and organic solvent acrylates (e.g., methyl methacrylate, hexyl methacrylate, beta-phenoxy ethyl acrylate, and hexamethylene acrylate). Other acceptable lacquers or matrices may include acrylated polyester oligomers such as CN292, CN293, CN294, SR351 (trimethylolpropane tri acrylate), SR395 (isodecyl acrylate), and SR256 (2(2-ethoxyethoxy) ethyl acrylate) (available from Sartomer Co., 502 Jones Way, Exton, Pa. 19341).

Fixing agents may include Lewis acids such as, by way of example only, transition metal cations. Other exemplary examples may include salts comprising $Fe^{3+}$, $Cu^{2+}$, $Ni^{2+}$, $Co^{2+}$, $Zn^{2+}$, $Fe^{2+}$, $Mn^{2+}$, $Zr^{4+}$, $Al^{3+}$, or $Sn^{2+}$. Other exemplary examples may include zinc stearate, zinc undecylenate, zinc oleate, zinc caprilate, zinc laurate, zinc linoleate, aluminum oleate, aluminum palmitate, aluminum stearate, copper stearate, iron stearate, manganese stearate, manganese naphthenate, nickel oleate, tin oleate, transition metal/organic acid salts, and transition metal/fatty aliphatic acid salts. It may also be desirable that the fixing agent is easily meltable or fuseable at the temperatures at which the color begins to develop.

EXAMPLE

An IR-sensitized bisphenol-A alloy was prepare by dissolving IR780 dye into a bisphenol-A hot melt. The alloy consisted of 97.26% bisphenol-A and 2.74% IR780. The alloy was cooled and ground into a fine powder. 14.31 g of the alloy powder, 1.54 g of Darocur-4265 (available from Ciba Specialty Chemicals, 540 White Plains Rd., PO Box 2005, Tarrytown, N.Y. 10591), and 4.92 g fine zinc stearate powder were sequentially mixed into 35.77 g of CDG000 UV-curable lacquer to form a lacquer mix.

An IR-sensitized 2-anilino-3-methyl-6-dibutylaminofluoran (leuco-dye alloy) was prepared by dissolving IR780 dye into a melt containing 2-anilino-3-methyl-6-dibutylaminofluoran (Formula 11) and m-terphenyl. The composition of the alloy was 90.45% 2-anilino-3-methyl-6-dibutylaminofluoran, 9.05% m-terphenyl, and 0.5% IR780. The leuco dye alloy was finely ground in a ball mill (particle size 1 μm-7 μm). 23.47 g of the finely ground leuco dye alloy was added to the lacquer mix.

(11)

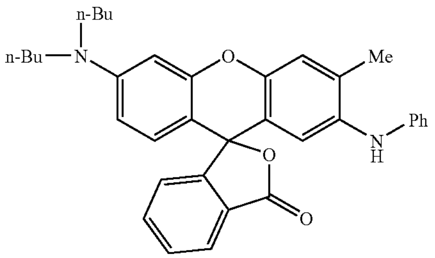

The resulting mixture was compounded on a 3-roll mill, applied to a substrate, and UV cured by the radiation of a mercury bulb. A mark was made with a 780 nm IR-laser of energy density of 0.1-0.5 $J/cm^2$.

The marked substrate was exposed to conditions of 35° C. and 80% relative humidity for 3 days. After 3 days, the imaged area showed contrast loss of less than 5%-10%. Similar coatings prepared without the addition of zinc stearate showed 60%-80% contrast loss in the same environment.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An imaging medium comprising:

a matrix;

an antenna for absorbing radiation having a predetermined wavelength;

a color former comprising a compound selected from the group consisting of leuco dyes and phthalide color formers;

an activator; and a fixer;

wherein one of the activator and the color former is soluble in the matrix at ambient conditions and the other suspended in the matrix as particles; and wherein said antenna, upon absorbing said radiation applied imagewise, causes localized heating and mixing of said color former and activator, and upon mixing, the activator activates the color former to change color and thereby effects a mark on said imaging medium; and wherein the fixer retards the fading of the activated color former.

2. The imaging medium of claim 1 wherein the fixer comprises a transition metal cation.

3. The imaging medium of claim 1 wherein the fixer comprises a Lewis acid.

4. The imaging medium of claim 1, wherein the fixer comprises a metal selected from the group consisting of Fe, Cu, Ni, Co, Zn, Fe, Mn, Zr, Al, and Sn.

5. The imaging medium of claim 1, wherein the fixer comprises a compound selected from the group consisting of zinc stearate, zinc undecylenate, zinc oleate, zinc caprilate, zinc laurate, zinc linoleate, aluminum oleate, aluminum palmitate, aluminum stearate, copper stearate, iron stearate, manganese stearate, manganese naphthenate, nickel oleate, and tin oleate.

6. A means for imaging, comprising:

a means for absorbing radiation energy having a predetermined wavelength;

a means for forming color, said color forming means comprising a compound selected from the group consisting of leuco dyes and phthalide color formers;

a means for activating the means for forming color;

a means for retarding color fading; and a means for binding the means for absorbing, the means for forming color, the means for activating, and the means for retarding;

wherein one of the activating means and the color forming means is soluble in the binding means at ambient conditions and the other is suspended in the binding means as particles, and wherein said absorbing means includes means for effecting localized heating of said color forming means and activating means, when said radiation energy applied imagewise is absorbed by said absorbing means.

7. The means for imaging of claim 6, wherein the means for retarding color fading comprises a Lewis acid.

8. The means for imaging of claim 6, wherein the means for retarding color fading comprises a transition metal cation.

9. The means for imaging of claim 6, wherein the means for retarding color fading comprises a metal selected from the group consisting of Fe, Cu, Ni, Co, Zn, Fe, Mn, Zr, Al, and Sn.

10. The means for imaging of claim 6, wherein the means for retarding color fading comprises a metal selected from the group consisting of zinc stearate, zinc undecylenate, zinc oleate, zinc caprilate, zinc laurate, zinc linoleate, aluminum oleate, aluminum palmitate, aluminum stearate, copper stearate, iron stearate, manganese stearate, manganese naphthenate, nickel oleate, and tin oleate.

11. An imaging medium, comprising:

a substrate;

an imaging composition disposed on said substrate and comprising:

a color changer comprising a compound selected from the group consisting of leuco dyes and phthalide color formers;

a developer for initiating a color change in the color changer;

an antenna for absorbing imagewise applied radiation having a predetermined wavelength and for delivering localized heat to said color changer and developer to cause said color change and thereby effects a mark on said imaging medium;

a fade resistor for retarding the fading of the developed color changer;

wherein one of the developer and the color changer is soluble in the composition at ambient conditions and the other is suspended in the composition as particles.

12. The imaging medium of claim 11, wherein the fade resistor comprises an electron acceptor.

13. The imaging medium of claim 11, wherein the fade resistor comprises a transition metal cation.

14. The imaging medium of claim 11 wherein the fade resistor comprises a metal selected from the group consisting of Fe, Cu, Ni, Co, Zn, Fe, Mn, Zr, Al, and Sn.

15. The imaging medium of claim 11 wherein the fade resistor comprises a metal selected from the group consisting of zinc stearate, zinc undecylenate, zinc oleate, zinc caprilate, zinc laurate, zinc linoleate, aluminum oleate, aluminum palmitate, aluminum stearate, copper stearate, iron stearate, manganese stearate, manganese naphthenate, nickel oleate, and tin oleate.

16. An imaging medium for forming a mark upon stimulation with radiation having a predetermined wavelength, said medium comprising:

a matrix;

an antenna for absorbing the radiation;

a color former;

an activator; and a fixer;

wherein the antenna, color former, activator and the fixer are different compounds;

wherein one of the activator and the color former is soluble in the matrix at ambient conditions and the other suspended in the matrix as particles;

wherein absorption of imagewise applied radiation of said predetermined wavelength by the antenna causes localized heating, which in turn causes mixing of said color former and said activator to effect a mark on said imaging medium;

wherein upon mixing the activator activates the color former to change color; and wherein the fixer retards the fading of the activated color former.

* * * * *

UNITED STATES PATENT AND TRADEMARK OFFICE

CERTIFICATE OF CORRECTION

PATENT NO. : 7,993,807 B2
APPLICATION NO. : 10/833728
DATED : August 9, 2011
INVENTOR(S) : Vladek Kasperchik et al.

It is certified that error appears in the above-identified patent and that said Letters Patent is hereby corrected as shown below:

In column 7, line 30, in Claim 5, delete "caprilate," and insert -- caprylate, --, therefor.

In column 8, line 2, in Claim 10, delete "caprilate," and insert -- caprylate, --, therefor.

In column 8, line 34, in Claim 15, delete "caprilate," and insert -- caprylate, --, therefor.

Signed and Sealed this
Twenty-eighth Day of February, 2012

David J. Kappos
*Director of the United States Patent and Trademark Office*